United States Patent
Wang et al.

(10) Patent No.: US 11,956,986 B2
(45) Date of Patent: Apr. 9, 2024

(54) FLEXIBLE DISPLAY SCREEN INCLUDING ENCAPSULATION PROTECTION LAYER, FLEXIBLE DISPLAY DEVICE, AND MANUFACTURING METHOD THEREOF

(71) Applicants: Chengdu BOE Optoelectronics Technology Co., Ltd., Sichuan (CN); BOE Technology Group Co., Ltd., Beijing (CN)

(72) Inventors: Yaming Wang, Beijing (CN); Liqiang Chen, Beijing (CN); Yanxin Wang, Beijing (CN); Chuntong Jiang, Beijing (CN); Jiali Wang, Beijing (CN); Xu Li, Beijing (CN); Rui Hou, Beijing (CN); Le Chang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 396 days.

(21) Appl. No.: 17/427,618

(22) PCT Filed: Jan. 6, 2021

(86) PCT No.: PCT/CN2021/070488
§ 371 (c)(1),
(2) Date: Jul. 30, 2021

(87) PCT Pub. No.: WO2021/147675
PCT Pub. Date: Jul. 29, 2021

(65) Prior Publication Data
US 2022/0102674 A1    Mar. 31, 2022

(30) Foreign Application Priority Data
Jan. 22, 2020    (CN) ......................... 202010075004.1

(51) Int. Cl.
*H10K 50/84*    (2023.01)
*H10K 50/80*    (2023.01)
(Continued)

(52) U.S. Cl.
CPC .......... *H10K 50/84* (2023.02); *H10K 50/868* (2023.02); *H10K 59/38* (2023.02); *H10K 59/40* (2023.02);
(Continued)

(58) Field of Classification Search
None
See application file for complete search history.

(56) References Cited

U.S. PATENT DOCUMENTS

2006/0257589 A1* 11/2006 Hayashi .................... C08B 3/18
536/64
2014/0367644 A1* 12/2014 Song .................. H10K 50/8426
438/26
(Continued)

FOREIGN PATENT DOCUMENTS

| CN | 104241316 A | 12/2014 |
| CN | 107068895 A | 8/2017 |

(Continued)

OTHER PUBLICATIONS

CN202010075004.1 first office action.
CN202010075004.1 second office action.
PCT/CN2021/070488 international search report.

*Primary Examiner* — Nduka E Ojeh
(74) *Attorney, Agent, or Firm* — IPro, PLLC

(57) ABSTRACT

A flexible display screen includes: a flexible substrate (1); an OLED device layer (2) formed on the flexible substrate (1); an encapsulation layer(3), disposed on the OLED device layer(2) and encapsulating the OLED device layer (2); and an encapsulation protection layer (4) formed on the encapsulation layer (3). The embodiments of the present disclo-
(Continued)

sure also provide a flexible display device and a manufacturing method of the flexible display screen.

17 Claims, 6 Drawing Sheets

(51) Int. Cl.
*H10K 59/38* (2023.01)
*H10K 59/40* (2023.01)
*H10K 71/00* (2023.01)
*H10K 77/10* (2023.01)
*H10K 102/00* (2023.01)

(52) U.S. Cl.
CPC ........... *H10K 71/00* (2023.02); *H10K 77/111* (2023.02); *H10K 2102/311* (2023.02)

(56) References Cited

U.S. PATENT DOCUMENTS

| | | | |
|---|---|---|---|
| 2017/0147852 A1* | 5/2017 | Benkley, III | G06V 40/1306 |
| 2019/0373719 A1 | 12/2019 | Lee et al. | |
| 2020/0117311 A1* | 4/2020 | Wu | G06F 3/0446 |
| 2020/0125199 A1* | 4/2020 | Feng | G06F 3/0443 |
| 2020/0219940 A1* | 7/2020 | Sasaki | H10K 50/844 |
| 2020/0343474 A1* | 10/2020 | Wang | H10K 50/84 |

FOREIGN PATENT DOCUMENTS

| | | |
|---|---|---|
| CN | 107134538 A | 9/2017 |
| CN | 111276629 A | 6/2020 |

* cited by examiner

FLEXIBLE DISPLAY SCREEN INCLUDING ENCAPSULATION PROTECTION LAYER, FLEXIBLE DISPLAY DEVICE, AND MANUFACTURING METHOD THEREOF

CROSS REFERENCE TO RELATED APPLICATIONS

The present application is a U.S. National Phase of International Application No. PCT/CN2021/070488, entitled "FLEXIBLE DISPLAY SCREEN, FLEXIBLE DISPLAY DEVICE AND MANUFACTURING METHOD OF FLEXIBLE DISPLAY SCREEN", and filed on Jan. 6, 2021. International Application No. PCT/CN2021/070488 claims priority to Chinese Patent Application No. 2020100750041 entitled "FLEXIBLE DISPLAY SCREEN, FLEXIBLE DISPLAY DEVICE AND MANUFACTURING METHOD OF FLEXIBLE DISPLAY SCREEN" filed on Jan. 22, 2020. The entire contents of each of the above-listed applications are hereby incorporated by reference for all purposes.

TECHNICAL FIELD

Embodiments of the present disclosure relate to a flexible display screen, a flexible display device and a manufacturing method of a flexible display screen.

BACKGROUND

With the continuous development of display technology, the trend of miniaturization and thinning of electronic products has gradually emerged, and flexible display screens have developed rapidly as driven by this trend. However, OLED (Organic Light-Emitting Diode) devices in flexible display screens tend to be corroded by water vapor and oxygen, resulting in shortened device life. An encapsulation layer can isolate water and oxygen and protect OLED devices.

In an existing flexible display screen, a flexible substrate at the lowermost layer has a larger elastic modulus and a larger thickness. When being bent, a neutral layer, which can be considered as a film layer subject to a zero or close to zero strain, is located near the flexible substrate. The encapsulation layer at the uppermost end receives the greatest strain and strain, and is prone to breakage, causing intrusion of water and oxygen, resulting in aging and failure of the OLED, shortening the service life of the flexible display. An OLED device layer located above the flexible substrate will also be subject to a certain strain, due to which the OLED device can be damaged.

SUMMARY

At least one embodiment of the present disclosure provides a flexible display screen, the flexible display screen including a flexible substrate; an OLED device layer disposed on the flexible substrate; an encapsulation layer, disposed on the OLED device layer and configured to encapsulate the OLED device layer; and an encapsulation protection layer disposed on the encapsulation layer.

In an embodiment of the present disclosure, the encapsulation protection layer has a thickness of 10 to 25 um, and the encapsulation protection layer has an elastic modulus of 4000 MPa to 14000 MPa.

In an embodiment of the present disclosure, a ratio of the thickness of the encapsulation protection layer to the thickness of the flexible substrate is 1:2 to 1.25:1.

In an embodiment of the present disclosure, the flexible display screen includes a touch control structure layer, and the touch control structure layer is disposed between the encapsulation layer and the encapsulation protection layer.

In an embodiment of the present disclosure, the flexible display screen includes a color filter layer disposed between the touch control structure layer and the encapsulation protection layer or on the encapsulation protection layer.

In an embodiment of the present disclosure, the flexible display screen includes a color filter layer on the encapsulation layer, and the color filter layer is disposed between the encapsulation layer and the encapsulation protection layer or is disposed on the encapsulation protection layer.

In an embodiment of the present disclosure, the flexible display screen includes a polarizer, a protective cover and a back film, the polarizer is adhered to the encapsulation protection layer, the protective cover is disposed on the polarizer, and the back film is adhered to the flexible substrate.

At least one embodiment of the present disclosure provides a flexible display device, including any flexible display screen as described above.

The present disclosure also provides a method for manufacturing a flexible display screen, which includes: providing a flexible substrate; forming an OLED device layer on the flexible substrate; forming an encapsulation layer on the OLED device layer; and forming an encapsulation protection layer on the encapsulation layer.

In an embodiment of the present disclosure, the encapsulation protection layer is formed by an inkjet printing process or a low-temperature coating process.

In an embodiment of the present disclosure, the encapsulation layer includes a first inorganic layer, an organic layer, and a second inorganic layer. The step of forming the encapsulation layer on the OLED device includes: forming the first inorganic layer on the OLED device layer by any one of a vacuum deposition process, a plasma-enhanced chemical vapor deposition process, and a sputtering process; forming the organic layer on the first inorganic layer through an inkjet printing process; and forming the second inorganic layer on the organic layer through a physical vapor deposition process or a chemical vapor deposition process.

In an embodiment of the present disclosure, the manufacturing method includes: before the step of forming the encapsulation protection layer, forming a color filter layer on the encapsulation layer, wherein the color filter layer is formed by an exposure process and a stripping process, and the encapsulation protection layer is formed on the color filter layer.

In an embodiment of the present disclosure, the manufacturing method includes: before the step of forming the encapsulation protection layer, forming a touch control structure layer on the encapsulation layer, wherein the touch control structure layer is formed by an exposure process, a plasma enhanced chemical vapor deposition process, a sputtering process, and a dry etching process.

In an embodiment of the present disclosure, the manufacturing method includes: forming a color filter layer on the touch control structure layer before the step of forming an encapsulation protection layer, wherein the color filter layer is formed by an exposure process and a stripping process, and the encapsulation protection layer is formed on the color filter layer.

In the present disclosure, the neutral layer can be changed upward by providing an encapsulation protection layer, so that the OLED device layer and the encapsulation layer are located close to the neutral layer, thereby reducing the strain on the OLED device and the encapsulation layer when the flexible display screen is bent. It can prevent the OLED device layer from being damaged due to excessive strain, and it also can avoid failure of the OLED device caused by entry of water and oxygen due to damage to the encapsulation layer.

DETAILED DESCRIPTION OF THE EMBODIMENTS

Figure 1:
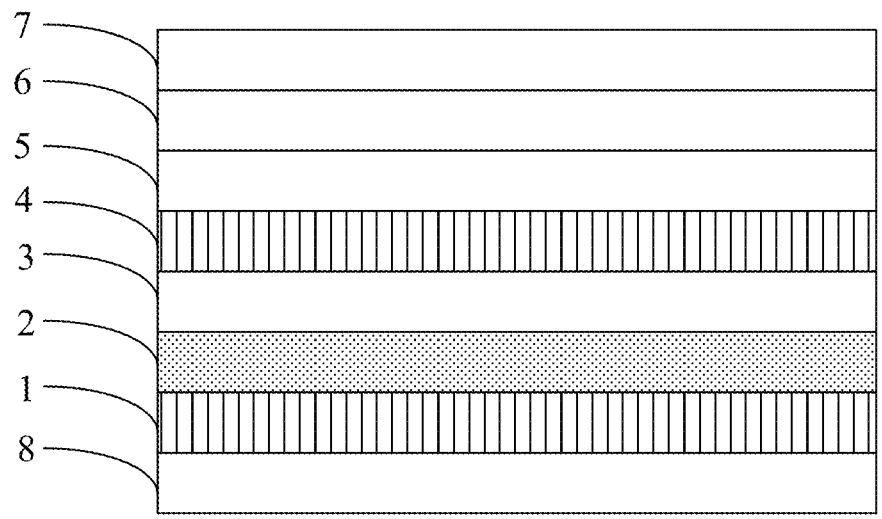
FIG. 1 shows a schematic structural diagram of a flexible display screen according to an embodiment of the present disclosure, in which an adhesive layer and an external film layer are not shown.

Embodiments will be described in detail herein, with the illustrations thereof represented in the drawings. When the following descriptions involve the drawings, like numerals in different drawings refer to like or similar elements unless otherwise indicated. The implements described in the following embodiments do not represent all implements consistent with the present disclosure. Rather, they are merely examples of apparatuses and methods consistent with some aspects of the present disclosure as detailed in the appended claims.

The terms used in the present disclosure are only for the purpose of describing specific embodiments, and are not intended to limit the present disclosure. Unless otherwise defined, the technical terms or scientific terms used in the present disclosure shall have the usual meanings understood by those with ordinary skills in the field to which the present disclosure belongs. The "first", "second" and similar terms used in the specification and claims of the present disclosure do not denote any order, quantity or importance, but are only used to distinguish different components. Also, similar terms such as "one" or "a" do not mean a quantity limit, but mean that there is at least one. "Multiple" or "several" means two or more. Unless otherwise indicated, similar terms such as "front", "rear", "lower" and/or "upper" are only for convenience of description, and are not limited to one position or one spatial orientation. "Comprising" or "including" and other similar terms mean that the elements or items before "comprising" or "including" now cover the elements or items listed after "comprising" or "including" and their equivalents, and do not exclude other elements or items. Similar terms such as "connected to" or "connected with" are not limited to physical or mechanical connections, and can include electrical connections, whether direct or indirect. The singular forms of "a", "said" and "the" used in the specification of the present disclosure and the appended claims are also intended to include plural forms, unless the context clearly indicates other meanings. It should also be understood that the term "and/or" as used herein refers to and includes any or all possible combinations of one or more associated listed items.

At least one embodiment of the present disclosure provides a flexible display screen. The flexible display screen includes a flexible substrate; an OLED device layer disposed on the flexible substrate; an encapsulation layer disposed on the OLED device layer and is configured to encapsulate the OLED device layer; and an encapsulation protection layer disposed on the encapsulation layer.

Figure 2:
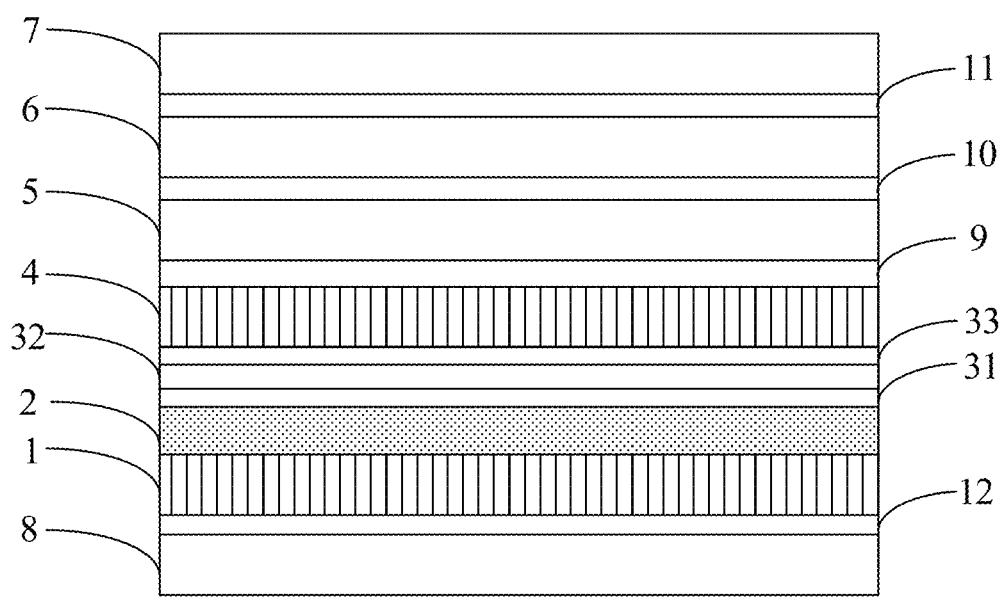
FIG. 2 shows a schematic structural diagram of the flexible display screen shown in FIG. 1, in which an adhesive layer and an external film layer are shown.

Referring to FIGS. 1 and 2, in an embodiment of the present disclosure, a flexible display screen includes a flexible substrate 1, an OLED device layer 2 disposed on the flexible substrate, an encapsulation layer 3 disposed on the OLED device layer 2, and an encapsulation protection layer 4 disposed on the encapsulation layer 3.

In the present disclosure, a direction from the flexible substrate 1 toward the OLED device layer 2 is an upward direction, and a direction from the OLED device layer 2 toward the flexible substrate 1 is a downward direction. It should be noted that the upward and downward directions are defined with respect to a display panel lying on a horizontal surface. The "upper" here only means relevant positions. For example, the OLED device layer 2 can be in contact with the flexible substrate 1, or some other film layers can be disposed between the two.

The flexible substrate 1 can be made of PI (polyimide film), PET (polyethylene terephthalate), or the like. In an embodiment of the present disclosure, the flexible substrate 1 can be made of PI (polyimide film). The OLED device layer includes an anode layer, an organic light-emitting layer, and a cathode layer. When an appropriate voltage is applied to the cathode layer and the anode layer, holes applied from the anode layer and the charges applied from the cathode layer are combined in the organic light-emitting layer to emit light. The OLED device can emit light of red, green, blue RGB and other colors depending on different formulations of the organic light-emitting layer to form basic colors.

The encapsulation layer 3 encapsulates the OLED device layer 2 to block water vapor and oxygen, and prevents water vapor and oxygen from entering the OLED device layer 2 and causing the OLED device to fail. The encapsulation layer 3 includes a first inorganic layer 31, an organic layer 32, and a second inorganic layer 33 that are sequentially disposed from bottom to top. However, the encapsulation layer 3 can also include more inorganic and organic layers, but generally speaking, it is necessary to ensure that the top layer of the encapsulation layer 3 is an inorganic layer, to effectively block water and oxygen. In an embodiment of the present disclosure, the material of the first inorganic layer 31 is SiON (silicon oxynitride), the material of the second inorganic layer 31 is SiN (silicon nitride), and the organic layer 31 can be made of organic materials suitable for inkjet printing.

The encapsulation protection layer 4 is configured to protect the OLED device layer 2 and the encapsulation layer 3. During the bending process of the flexible display screen, the outer layer is stretched and the inner layer is compressed. There will be a layer on its cross-section that is neither stretched nor compressed. In this layer, the strain is almost equal to zero and in the bending process, the length is essentially unchanged. This layer is referred to as a neutral layer of the flexible display screen. Since the encapsulation protection layer 4 is provided, the neutral layer can be changed upwards, so that the circuit layer in the OLED device layer 2 is located close to the neutral layer, thereby reducing the strain on the circuit layer in the OLED device when the flexible display screen is bent. At the same time, a distance between the encapsulation layer 3 and the neutral layer is reduced, which is also beneficial to avoid excessive strain on the encapsulation layer 3 and thus avoid damage to the encapsulation layer, thereby preventing the OLED device layer from being corroded by water vapor and oxygen. However, if the thickness of the encapsulation protection layer 4 is too large, the thickness of the flexible display screen will be larger, therefore, the position of the neutral layer can be adjusted by changing the elastic modulus of the encapsulation protection layer 4. When the encapsulation protection layer 4 uses a material with a larger elastic modulus, the thickness of the encapsulation protection layer 4 can be provided thinner; and when the encapsulation protection layer 4 uses a smaller elastic modulus, the thickness of the encapsulation protection layer 4 needs to be provided thicker. In other words, the thickness of the encapsulation protection layer 4 is negatively related to the elastic modulus of the encapsulation protection layer 4.

Continuing to refer to FIGS. 1 and 2, the flexible display screen also includes other film layers connected to each of the above-mentioned film layers through adhesive layers. For example, the flexible display screen further includes a first adhesive layer 9, a polarizer 5, a second adhesive layer 10, a touch panel 6 (TSP), a third adhesive layer 11, and a protective cover 7, a fourth adhesive layer 12 or a back film 8. The polarizer 5 is bonded to and disposed on the encapsulation protection layer 4 through the first adhesive layer 9; the touch panel 6 is bonded to and disposed on the polarizer 5 through the second adhesive layer 10; the protective cover 7 is bonded to and disposed on the touch panel 6 through the third adhesive layer 11; and the back film 8 is bonded to and disposed under the flexible substrate 1 through the fourth adhesive layer 12. In an embodiment of the present disclosure, the first adhesive layer 9 and the fourth adhesive layer 12 are laminated adhesives, and the second adhesive layer 10 and the third adhesive layer 11 are OCA (Optically Clear Adhesive). The flexible display screen also includes a color filter layer, and the color filter layer can be adhered on top of the encapsulation protection layer through an adhesive layer, which is not shown in FIG. 1 and FIG. 2.

In some embodiments of the present disclosure, the encapsulation protection layer 4 is made of organic material, such as PI, with a thickness of 10-25 um and an elastic modulus of 4000 MPa-14000 Mpa. However, in some other embodiments of the present disclosure, when the thickness and elastic modulus of the encapsulation protection layer 4 are outside the above ranges, the encapsulation protection layer 4 can also protect the encapsulation layer 3 and the OLED device layer 2 to a certain extent. The increased thickness of the flexible display screen can be balanced by reducing a thickness of an adhesive layer such as the second adhesive layer 10. The thickness range of the encapsulation protection layer 3 can be calculated through model simulation.

Figure 3:
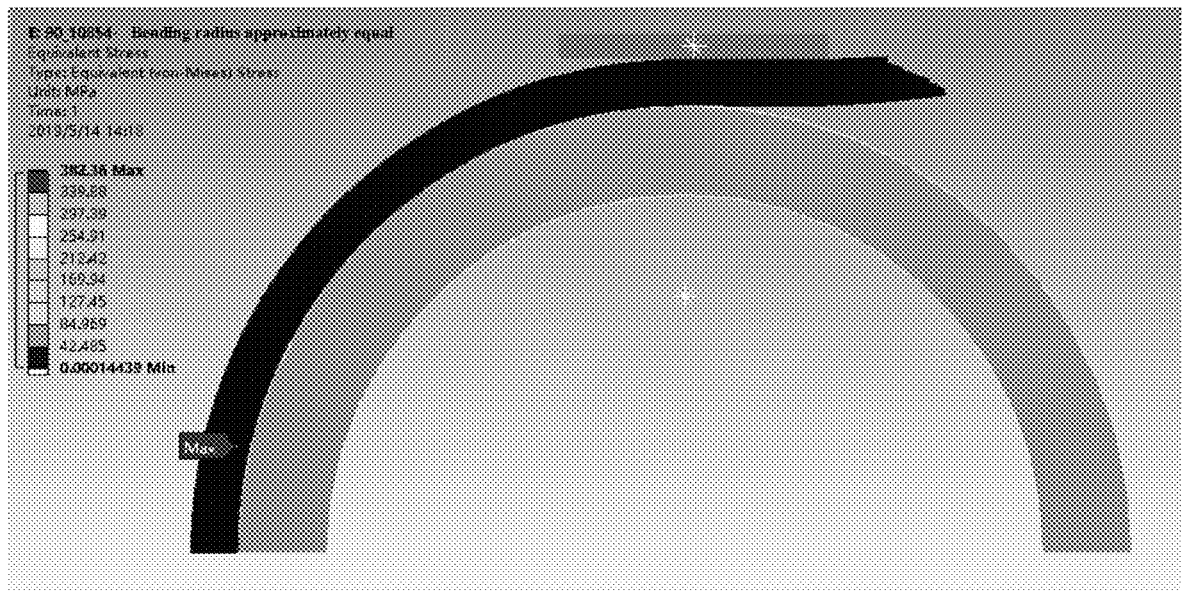
FIG. 3 shows a contour plot of a radial cross-sectional strain when the flexible display screen is bent.
Figure 4:
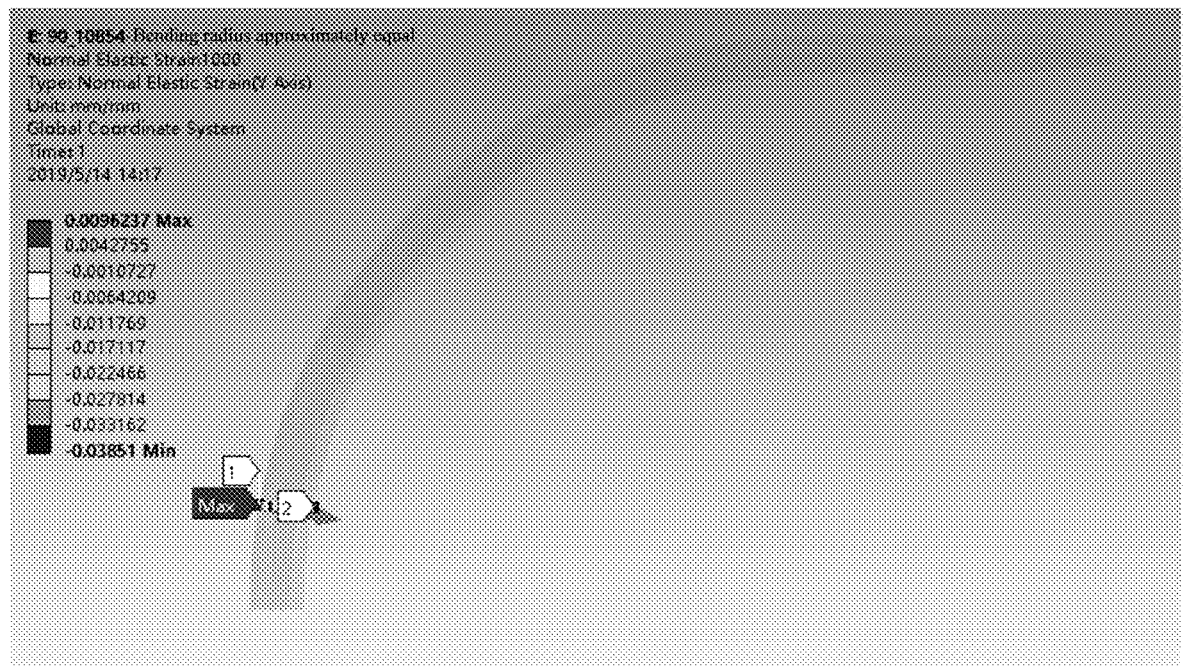
FIG. 4 shows a contour plot of a radial cross-sectional strain when the flexible display screen is bent.
Figure 5:
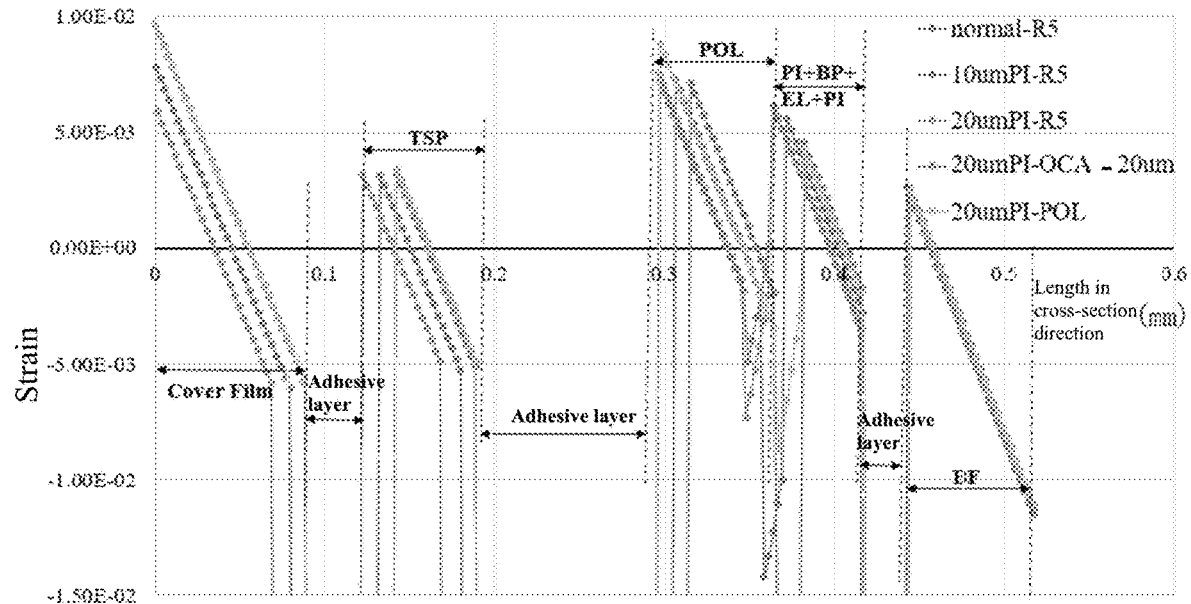
FIG. 5 shows a graph of radial cross-sectional strains of the film layers, which is extracted from FIG. 4.
Figure 6:
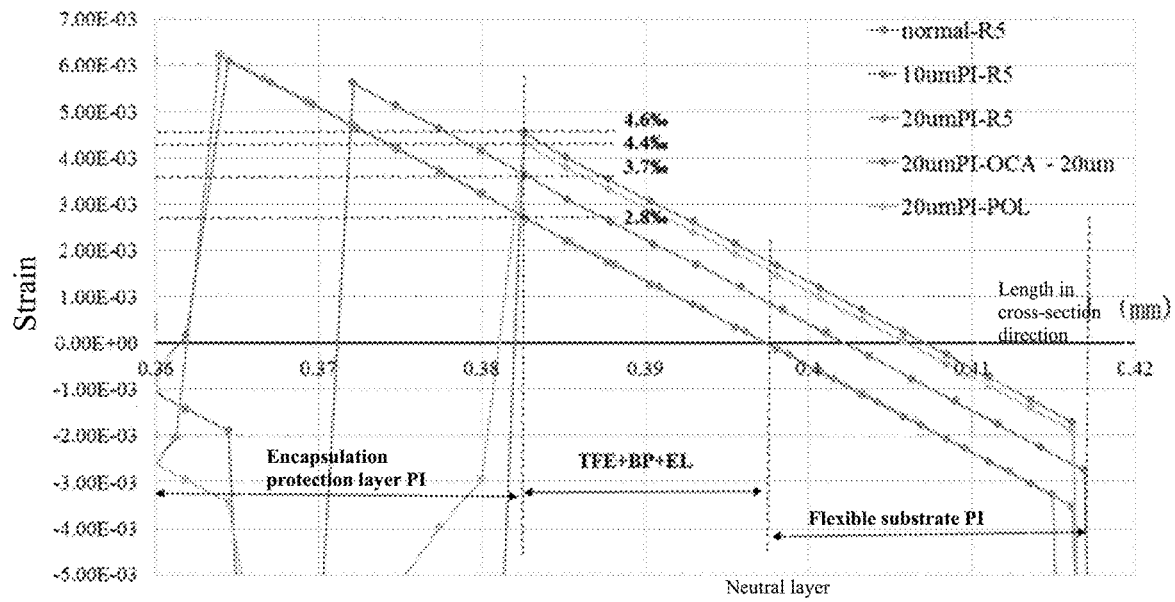
FIG. 6 shows a graph of radial cross-sectional strains of the flexible substrate and the OLED device layer, which is extracted from FIG. 4.

FIGS. 3 to 6 show the simulation results when the flexible display screen is bent without the encapsulation protection layer. Here, FIG. 3 shows a contour plot of a radial cross-sectional strain when the flexible display screen is bent, FIG. 4 shows a contour plot of a radial cross-sectional strain when the flexible display screen is bent, FIG. 5 shows a graph of radial cross-sectional strains of the film layers, which is extracted from FIG. 4, and FIG. 6 a graph of radial cross-sectional strains of the flexible substrate and the OLED device layer, which is extracted from FIG. 4.

FIGS. 3 to 6 show the following sets of simulation results.

The first set of simulation results: when the flexible display is bent without the encapsulation protection layer, the encapsulation layer 3 (corresponding to TFE in the simulation diagram) has a maximum strain of 4.6%, and the OLED device layer 2 (corresponding to BP+EL in the simulation diagram) has a maximum strain of 2.5%.

The second set of simulation results: when a 10 um encapsulation protection layer (corresponding to the encapsulation protection layer PI) is provided on the encapsulation layer 3, and the flexible display screen is subjected to bending simulation. Then the encapsulation layer 3 and the OLED device layer 2 have a maximum strain of 3.7%.

The third set of simulation results: when a 20 um encapsulation protection layer is provided on the encapsulation layer 3, the flexible display screen is subjected to bending simulation. Then, the encapsulation layer 3 has a maximum strain of 2.8%, and the OLED device layer 2 has a maximum strain of 0.6%.

The fourth set of simulation results: when a 20 um encapsulation protection layer is provided on the encapsulation layer 3, the second adhesive layer 10 is reduced by 20 um in thickness at the same time, and the flexible display screen is subjected to bending simulation. Then, the encapsulation layer 3 has a maximum strain of 2.8%, and the OLED device layer 2 has a maximum strain of 0.6%.

The fifth set of simulation results: when a 20 um encapsulation protection layer is provided on the first adhesive layer 9, and the flexible display is subjected to bending simulation. Then, the encapsulation layer 3 and the OLED device layer 2 have a maximum strain of 4.4%.

By comparison of the simulation results of the first, second and third sets, it can be seen that as the thickness of the encapsulation protection layer 4 on the encapsulation layer 3 increases, the maximum strain on the encapsulation layer 3 and the OLED device layer 2 gradually decreases. When the thickness of the encapsulation protection layer 4 is 20 um, the encapsulation layer 3 and the OLED device layer 2 are already close to the neutral layer, the maximum strain on encapsulation layer 3 is reduced from 4.6% to 2.8%, and the maximum strain on OLED device layer 2 is reduced from 2.5% to 0.6%.

Comparing the third set of simulation results with the fourth set of simulation results, it is found that after adding a 20 um-thick encapsulation protection layer on the encapsulation layer 3, the thickness of the second adhesive layer 10 is reduced by 20 um, which has no effect on the maximum strain on the encapsulation layer 3 and the OLED device layer 2. Therefore, the thickness of the encapsulation protection layer 4 can be offset by reducing the thickness of the second adhesive layer 10 or of other adhesive layers, so as to maintain the thickness of the OLED screen unchanged.

By comparison of the first set of simulation results and the fifth set of simulation results, it is found that a 20 um thick encapsulation protection layer 4 is added on the first adhesive layer 9, that is, a glue layer is provided between the encapsulation protection layer 4 and the flexible substrate 1. Then, the maximum strain on the encapsulation layer 3 and the OLED device layer 2 is not significantly reduced, and the encapsulation protection layer 4 cannot effectively protect the encapsulation layer 3 and the OLED device layer 2 at this time.

In the above simulation, the thickness of the flexible substrate 1 is 20 um, and the elastic modulus is 7000 MPa. In other embodiments of the present disclosure, the ratio of the thickness of the encapsulation protection layer 4 to the thickness of the flexible substrate 1 is between 1:2 and 1.25:1, so that the encapsulation protection layer 4 and the flexible substrate 1 form an approximately symmetrical structure, which allows the encapsulation layer 3 and the OLED device layer to be better protected regardless of whether the flexible display screen is bent inward or outward.

Figure 7:
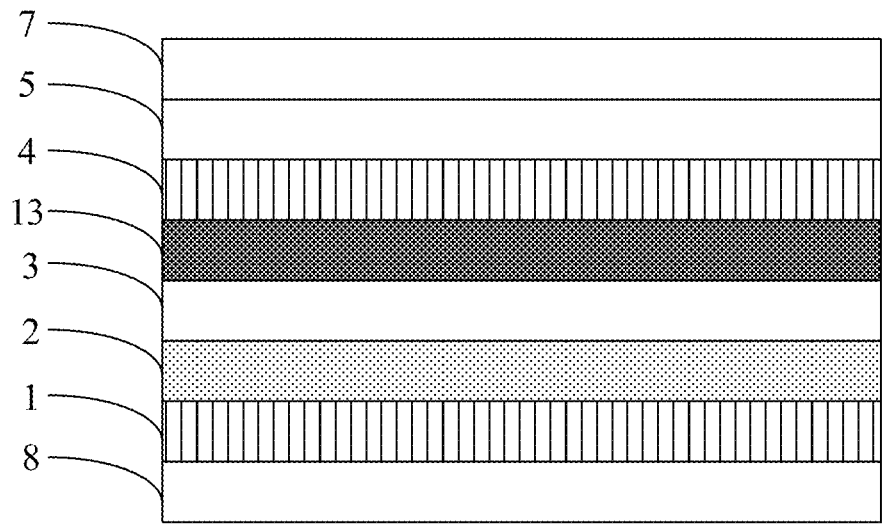
FIG. 7 shows a schematic structural diagram of a flexible display screen according to another embodiment of the present disclosure.

FIG. 7 shows a schematic structural diagram of a flexible display screen according to another embodiment of the present disclosure. As shown in FIG. 7, with respect to the above embodiment, the flexible display screen further includes a touch control structure layer (FMLOC, Flexible Multi-Layer On Cell) 13. Since the touch control structure layer is disposed in the film structure, there is no need to additionally provide a touch panel, which is beneficial to reduce the thickness of the flexible display screen. The touch control structure layer 13 is formed on the encapsulation layer 3, and the encapsulation protection layer 4 is formed on the touch control structure layer 13. Similar to the structure shown in FIG. 1 and FIG. 2, the encapsulation protection layer 4 shown in FIG. 7 can effectively protect the encapsulation layer 3 and the OLED device layer 2 and restrain the deformation during bending. It should be noted that since the touch control structure layer 13 is provided in the flexible display screen shown in FIG. 7, the neutral layer can also be changed upwards to some degree. The thickness of the encapsulation protection layer 4 in the flexible display screen with the touch control structure layer can be slightly smaller than the thickness of the encapsulation protection layer in the flexible display screen without the touch control structure layer.

Figure 8:
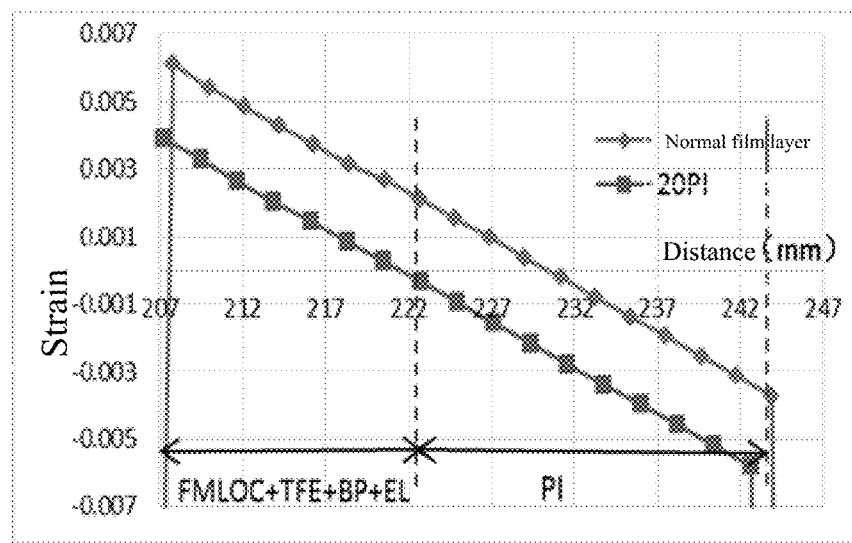
FIG. 8 shows a graph of a radial cross-sectional strain on the flexible display screen shown in FIG. 7.

Referring to FIG. 8, a 20 um encapsulation protection layer 4 is provided on the touch control structure layer 13. The bending strain on the touch control structure layer 13 and the encapsulation layer is reduced from 6% to 3.8%, and the bending strain on the OLED device layer is reduced from 2.1% to 0%. In this simulation scenario, the thickness of the flexible substrate 1 is 20 um, the elastic modulus is 7000 MPa, the elastic modulus of the selected material for the encapsulation protection layer 4 is set to 4000 MPa to 14000 MPa, and the thickness is set to 10 to 25 um.

Figure 9:
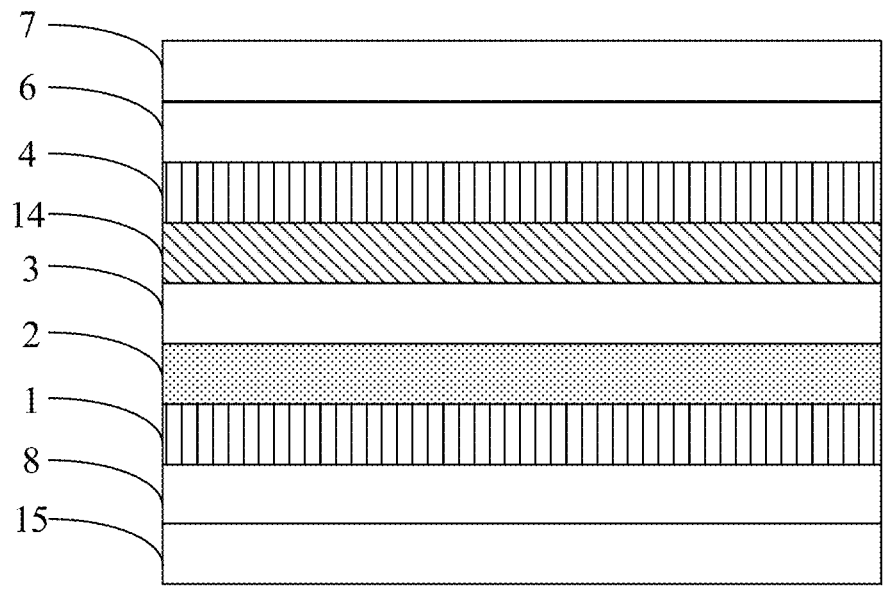
FIG. 9 shows a schematic structural diagram of a flexible display screen according to another embodiment of the present disclosure.

FIG. 9 shows a schematic structural diagram of a flexible display screen according to another embodiment of the present disclosure. Compared with the structure shown in FIG. 1 and FIG. 2, the flexible display screen shown in FIG. 9 further includes a color filter layer (COE, Color Filter On Encapsulation) 14, and the color filter layer 14 is disposed on the encapsulation layer 3, the encapsulation protection layer 4 is disposed on the color filter layer 14. The color filter layer 14 includes a black matrix and color blocks disposed in holes disposed in an array formed in the black matrix. In some embodiments of the present disclosure, the encapsulation protection layer 4 can also be disposed between the encapsulation layer 3 and the color filter layer 14.

Similar to the structure shown in FIG. 1 and FIG. 2, the encapsulation protection layer can effectively protect the encapsulation layer 3 and the OLED device layer 2 and restrain their deformation during bending. It should be noted that due to the addition of the color filter layer 14, the neutral layer can also be changed upwards to a certain extent. Therefore, the thickness of the encapsulation protection layer 4 in the flexible display screen with the color filter layer can be slightly smaller than the thickness of the encapsulation protection layer in a flexible display screen without a color filter layer.

In an embodiment of the present disclosure, as shown in FIG. 9, the flexible display screen further includes a SUS (stainless steel) film 15, and the SUS film 15 is adhered to the back film 8 through an adhesive layer. The SUS film 15 has a certain strength and can restrain deformation of a part of the film layers.

Figure 10:
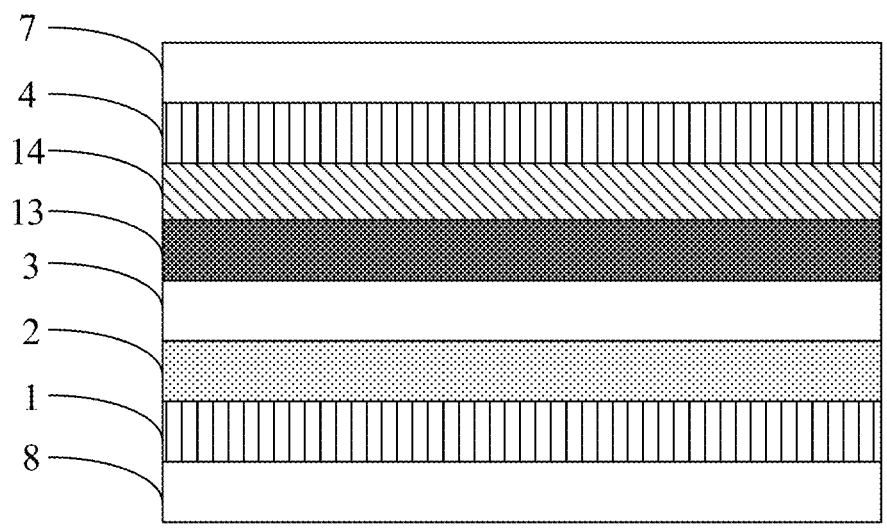
FIG. 10 shows a schematic structural diagram of a flexible display screen according to another embodiment of the present disclosure.

FIG. 10 shows a schematic structural diagram of a flexible display screen according to another embodiment of the present disclosure. Compared with the structure of the flexible display screen shown in FIGS. 1 and 2, the flexible display screen shown in FIG. 10 further includes a touch control structure layer 13 and a color filter layer 14. The touch control structure layer 13 is disposed on the encapsulation layer 3, the color filter layer 14 is disposed on the touch control structure layer 13, and the encapsulation protection layer 4 is disposed on the color filter layer 14. In an embodiment of the present disclosure, the encapsulation protection layer 4 can also be disposed between the touch control structure layer 13 and the color filter layer 14.

Similar to the structure shown in FIG. 1 and FIG. 2, the encapsulation protection layer can effectively protect the encapsulation layer 3 and the OLED device layer 2 and restrain their deformation during bending. It should be noted that due to the addition of the color filter layer 14, the neutral layer can also be changed upwards to a certain extent. Therefore, the thickness of the encapsulation protection layer 4 in the flexible display screen with both the touch control structure layer and the color filter layer are provided can be slightly smaller than the thickness of the encapsulation protection layer in a flexible display screen with only the touch control structure layer or the color filter layer.

At least one embodiment of the present disclosure also provides a flexible display device. The flexible display device can be an electronic device with a display screen such as a mobile phone, a tablet computer, or a notebook computer. The flexible display device includes the flexible display screen of any one of the above embodiments.

Figure 11:
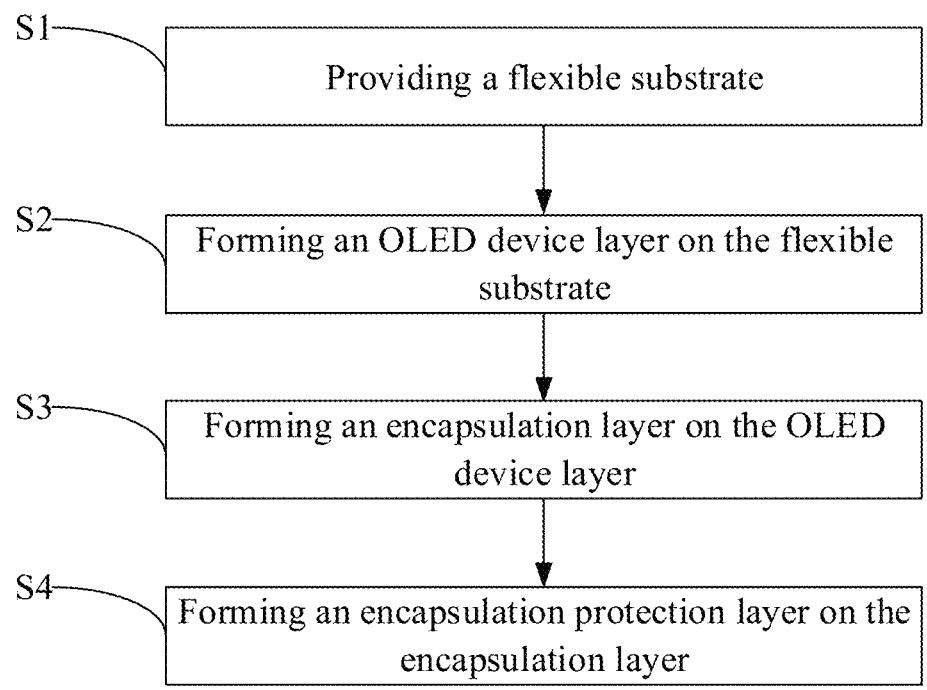
FIG. 11 shows a schematic flowchart of a manufacturing method of a flexible display screen according to an embodiment of the present disclosure.

At least one embodiment of the present disclosure also provides manufacturing method of a flexible display screen. FIG. 11 shows a flow chart of a manufacturing method of a flexible display screen according to an embodiment of the present disclosure. As shown in FIG. 11, the manufacturing method includes the following steps.

Step S1: a flexible substrate 1 is provided.

Step S2: an OLED device layer 2 is formed on the flexible substrate 1.

Step S3: an encapsulation layer 3 is formed on the layer 2 of the OLED device.

Step S4: an encapsulation protection layer 4 is formed on the encapsulation layer 3.

In an embodiment of the present disclosure, the encapsulation layer 3 includes a first inorganic layer 21, an organic layer 22, and a second inorganic layer 23. In an embodiment of the present disclosure, after the OLED device layer is formed on the flexible substrate through an evaporation process, any one of a vacuum deposition process, a plasma-enhanced chemical vapor deposition process, and a sputtering process can be used to form the OLED device layer on the flexible substrate. The first inorganic layer 21 is formed on the OLED device layer 2, and the organic layer 22 is formed on the first inorganic layer 21 by an inkjet printing process; by a physical vapor deposition process or a chemical vapor deposition process, the second inorganic layer 23 is formed on the organic layer 22; acrylate is printed on the second inorganic layer 23 through an inkjet printing process or PI is coated on the second inorganic layer 23 through a low-temperature coating process to form the encapsulation protection layer 4; finally, external film layers, such as the polarizer 5, the touch panel 6, the protective cover 7 and the back film 8, etc., are adhered through the adhesive layers. In this way, a flexible display screen as shown in FIG. 1 or FIG. 2 can be manufactured.

In an embodiment of the present disclosure, before the step of forming the encapsulation protection layer, a touch control structure layer is formed on the encapsulation layer; the touch control structure layer is formed by an exposure process, a plasma-enhanced chemical vapor deposition process, a sputtering process and a dry etching process, and the encapsulation protection layer is formed on the touch control structure layer. In this way, the flexible display screen shown in FIG. 7 can be formed.

In another embodiment of the present disclosure, before the step of forming the encapsulation protection layer, a color filter layer is formed on the encapsulation layer by an exposure process and a stripping process, and then, the encapsulation protection layer is formed on the color filter layer. In this way, a flexible display screen as shown in FIG. 9 can be made.

In other embodiments, before the step of forming the encapsulation protection layer, a touch control structure layer is formed on the encapsulation layer, a color filter layer is formed on the touch control structure layer, and the encapsulation protection layer is formed on the color filter layer. The touch control structure layer is formed by an exposure process, a plasma enhanced chemical vapor deposition process, a sputtering process, and a dry etching process, and the color filter layer is formed by an exposure process and a stripping process. In this way, a flexible display screen as shown in FIG. 9 can be made.

In the present disclosure, the neutral layer can be changed upward by providing an encapsulation protection layer, so that the OLED device layer and the encapsulation layer are located close to the neutral layer, thereby reducing the strain on the OLED device and the encapsulation layer when the flexible display screen is bent. It can prevent the OLED device layer from being damaged due to excessive strain, and it also can avoid failure of the OLED device caused by entry of water and oxygen due to damage to the encapsulation layer.

The above are only the preferred embodiments of the present disclosure, and do not limit the present disclosure in any form. Although the present disclosure has been disclosed as above in preferred embodiments, it is not intended to limit the present disclosure. Those skilled in the art can make use of the technical content disclosed above to make slight changes or modifications to obtain equivalent implementations with equivalent changes without departing from the scope of the technical solution of the present disclosure, but any content that does not depart from the technical solution of the present disclosure, any simple modifications, equivalent changes and modifications made to the above embodiments based on the technical essence of the present disclosure still fall within the scope of the technical solutions of the present disclosure.

What is claimed is:

1. A flexible display screen comprising: a flexible substrate; an OLED device layer disposed on the flexible substrate; an encapsulation layer, disposed on the OLED device layer and encapsulating the OLED device layer; and an encapsulation protection layer formed on the encapsulation layer, wherein the encapsulation protection layer is made of polyimide (PI), the encapsulation protection layer has a thickness of 10-25 um, and the encapsulation protection layer has an elastic modulus of 4000 MPa-14000 MPa, a ratio of a thickness of the encapsulation protection layer to a thickness of the flexible substrate is 1:2 to 1.25:1, the flexible substrate has a thickness of 20 um and an elastic modulus of 7000 MPa.

2. The flexible display screen of claim 1, wherein a thickness of the encapsulation protection layer is negatively related to an elastic modulus of the encapsulation protection layer.

3. The flexible display screen according to claim 1, wherein the flexible display screen comprises a touch control structure layer formed on the encapsulation layer, and the touch control structure layer is disposed between the encapsulation layer and the encapsulation protection layer.

4. The flexible display screen according to claim 1, wherein the flexible display screen comprises a touch control structure layer and a color filter layer, and the touch control structure layer is disposed between the encapsulation layer and the encapsulation protection layers, the color filter layer is disposed between the touch control structure layer and the encapsulation protection layer or on the encapsulation protection layer.

5. The flexible display screen according to claim 1, wherein the flexible display screen comprises a color filter layer, and the color filter layer is disposed between the encapsulation layer and the encapsulation protection layer or on the encapsulation protection layer.

6. The flexible display screen according to claim 1, further comprising:
    a polarizer attached to the encapsulation protection layer;
    a protective cover disposed on the polarizer; and
    a back film attached to the flexible substrate.

7. A flexible display device comprising the flexible display screen according to claim 1.

8. The flexible display screen of claim 1, wherein the thickness of the encapsulation protection layer is negatively related to the elastic modulus of the encapsulation protection layer.

9. The flexible display screen according to claim 1, wherein a ratio of the thickness of the encapsulation protection layer to the thickness of the flexible substrate is 1:2 to 1.25:1.

10. The flexible display screen according to claim 1, wherein the flexible display screen comprises a touch control structure layer and a color filter layer, and the touch control structure layer is disposed between the encapsulation layer and the encapsulation protection layers, the color filter layer is disposed between the touch control structure layer and the encapsulation protection layer or on the encapsulation protection layer.

11. A manufacturing method of flexible display screen, comprising:
    providing a flexible substrate;
    forming an OLED device layer on the flexible substrate;

forming an encapsulation layer on the OLED device layer; and forming an encapsulation protection layer on the encapsulation layer, wherein the encapsulation protection layer is made of polyimide PI, the encapsulation protection layer has a thickness of 10-25 um, and the encapsulation protection layer has an elastic modulus of 4000 MPa-14000 MPa, a ratio of a thickness of the encapsulation protection layer to a thickness of the flexible substrate is 1:2 to 1.25:1, the flexible substrate has a thickness of 20 um and an elastic modulus of 7000 MPa.

12. The manufacturing method according to claim 11, wherein the encapsulation protection layer is formed by an inkjet printing process or a low-temperature coating process.

13. The manufacturing method according to claim 11, wherein the encapsulation layer comprises a first inorganic layer, an organic layer, and a second inorganic layer, and forming the encapsulation layer on the OLED device comprises:

forming the first inorganic layer on the OLED device layer by any one of a vacuum deposition process, a plasma-enhanced chemical vapor deposition process, and a sputtering process;

forming the organic layer on the first inorganic layer through an inkjet printing process; and forming the second inorganic layer on the organic layer through a physical vapor deposition process or a chemical vapor deposition process.

14. The manufacturing method according to claim 11, comprising: after forming the encapsulation layer and before forming the encapsulation protection layer, applying an exposure process and a stripping process on the encapsulation layer to form a color filter layer, wherein the encapsulation protection layer is formed on the color filter layer.

15. The manufacturing method according to claim 11, comprising: after forming the encapsulation layer and before forming the encapsulation protection layer, forming a touch control structure layer on the encapsulation layer by an exposure process, a plasma enhanced chemical vapor deposition process, a sputtering process, and a dry etching process, wherein the encapsulation protection layer is formed on the touch control structure layer.

16. The manufacturing method according to claim 15, further comprising: before forming the encapsulation protection layer, forming a color filter layer on the touch control structure layer by an exposure process and a stripping process, wherein the encapsulation protection layer is formed on the color filter layer.

17. The manufacturing method according to claim 15, further comprising: forming a color filter layer on the encapsulation protection layer by an exposure process and a stripping process.

* * * * *